United States Patent
Corbett et al.

(10) Patent No.: US 10,346,572 B1
(45) Date of Patent: Jul. 9, 2019

(54) INCLUSION AND CONFIGURATION OF A TRANSACTION CONVERTER CIRCUIT BLOCK WITHIN AN INTEGRATED CIRCUIT

(71) Applicant: Xilinx, Inc., San Jose, CA (US)

(72) Inventors: Kyle Corbett, Campbell, CA (US); Khang K. Dao, San Jose, CA (US)

(73) Assignee: XILINX, INC., San Jose, CA (US)

( * ) Notice: Subject to any disclaimer, the term of this patent is extended or adjusted under 35 U.S.C. 154(b) by 219 days.

(21) Appl. No.: 15/424,684

(22) Filed: Feb. 3, 2017

(51) Int. Cl.
*G06F 17/50* (2006.01)

(52) U.S. Cl.
CPC ...... *G06F 17/5045* (2013.01); *G06F 17/5009* (2013.01)

(58) Field of Classification Search
CPC ............. G06F 17/5022; G06F 17/5045; G06F 11/3656; G01R 31/317; G01R 31/31701; G01R 31/31704
USPC .......................................... 716/106, 116–117
See application file for complete search history.

(56) References Cited

U.S. PATENT DOCUMENTS

| | | | | |
|---|---|---|---|---|
| 2008/0120082 A1* | 5/2008 | Alexanian | ........ | G01R 31/31831 703/14 |
| 2008/0253401 A1* | 10/2008 | Thyagarajan | ......... | H04L 5/0042 370/485 |
| 2012/0046930 A1* | 2/2012 | Schaub | ............... | G06F 17/5022 703/13 |
| 2015/0189046 A1* | 7/2015 | Worrell | ................... | H04L 69/22 370/474 |
| 2015/0204847 A1* | 7/2015 | Thomas | ............... | G01N 33/502 506/12 |
| 2016/0109519 A1* | 4/2016 | Vadhavania | ..... | G01R 31/31701 714/731 |
| 2016/0110275 A1* | 4/2016 | Michalovich | ....... | G06F 11/3656 714/43 |
| 2018/0167829 A1* | 6/2018 | Luo | ....................... | H04W 24/02 |

OTHER PUBLICATIONS

"VIVADO Design Suite, AXI Reference Guide," UG1037, (v3.0) Jun. 24, 2015, Chapter 5, <http://www.xilinx.com/support/documentation/ip_documentation/axi_ref_guide/latest/ug1037-vivado-axi-reference-guide.pdf>, pp. 1-175, Xilinx, Inc., San Jose, CA USA.

* cited by examiner

Primary Examiner — Paul Dinh
(74) Attorney, Agent, or Firm — Kevin T. Cuenot

(57) ABSTRACT

A method of circuit design can include detecting, using a processor, a transactional inefficiency within trace data including transactions involving a first circuit block of a circuit design and, in response to the detecting, generating a modified version of the circuit design by including a transaction converter circuit block within the circuit design. The transaction converter circuit block can be coupled to the first circuit block and can be adapted to correct the transactional inefficiency.

20 Claims, 3 Drawing Sheets

INCLUSION AND CONFIGURATION OF A TRANSACTION CONVERTER CIRCUIT BLOCK WITHIN AN INTEGRATED CIRCUIT

FIELD OF THE INVENTION

This disclosure relates to integrated circuits (ICs) and, more particularly, to inclusion and configuration of a transaction converter circuit block within an IC.

BACKGROUND

A "system-on-chip" or SOC is an integrated circuit (IC) that includes a processor adapted to execute program code and one or more circuit blocks. The circuit blocks may be implemented as hardwired circuitry, programmable circuitry, and/or a combination thereof. The circuit blocks may operate cooperatively with one another and/or with the processor. The processor and the circuit blocks are typically implemented on a same die. The circuit blocks may be Intellectual Properties (IPs) or cores coupled together and/or coupled to the processor.

Within the SOC, the processor and/or the circuit blocks exchange transactions with one another. As an illustrative example, a first circuit block may operate as a master. The first circuit block may be the processor or any of a variety of different types of circuit blocks. The first circuit block is coupled to a second circuit block through interface circuitry. The second circuit block may operate as a slave. For example, the second circuit block may be a memory controller. Efficient operation of the SOC requires efficient communication between the circuit blocks and the processor. A mismatch in communication between the circuit blocks and/or the processor results in degraded performance of the SOC.

SUMMARY

One or more embodiments are directed to methods of circuit design. In one aspect, a method can include detecting, using a processor, a transactional inefficiency within trace data including transactions involving a first circuit block of a circuit design and, in response to the detecting, generating a modified version of the circuit design by including a transaction converter circuit block within the circuit design. The transaction converter circuit block can be coupled to the first circuit block and can be adapted to correct the transactional inefficiency.

One or more embodiments are directed to systems for circuit design. In one aspect, a system includes a processor configured to detect a transactional inefficiency within trace data including transactions involving a first circuit block of a circuit design and, in response to detecting the transactional inefficiency, generate a modified version of the circuit design by including a transaction converter circuit block within the circuit design. The transaction converter circuit block can be coupled to the first circuit block and can be adapted to correct the transactional inefficiency.

One or more embodiments are directed to computer program products for circuit design. In one aspect, a computer program product includes a computer readable storage medium having program code stored thereon. The program code is executable by a processor to cause the processor to detect a transactional inefficiency within trace data including transactions involving a first circuit block of a circuit design and, in response to detecting the transactional inefficiency, generate a modified version of the circuit design by including a transaction converter circuit block within the circuit design. The transaction converter circuit block can be coupled to the first circuit block and can be adapted to correct the transactional inefficiency.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

DETAILED DESCRIPTION OF THE DRAWINGS

Figure 1:
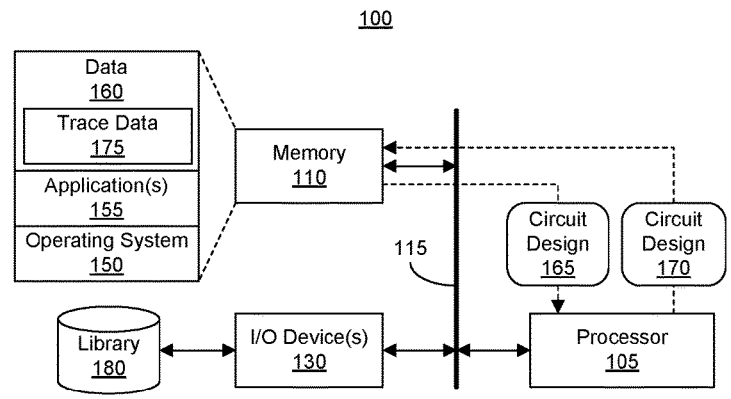
FIG. 1 illustrates an example data processing system.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to inclusion and configuration of a transaction converter circuit block within an IC. One or more embodiments described within this disclosure relate to using trace data to detect when a transaction converter circuit block should be included within a circuit design. The circuit design is selectively modified to include the transaction converter circuit block to improve performance of the circuit design and/or the IC in which the circuit design is implemented (e.g., the "target IC").

In one or more embodiments, a system is capable of analyzing trace data for the circuit design to detect one or more transactional inefficiencies therein. A transactional inefficiency is a predetermined condition found to exist transactions exchanged between two or more circuit blocks. The system, for example, is capable of analyzing trace data specifying transactions for one or more circuit blocks, e.g., for a selected circuit block, within the IC or within a circuit design. In response to detecting one or more transactional inefficiencies within the trace data, the system is capable of automatically including a transaction converter circuit block within the circuit design. The transaction converter circuit block is adapted to modify the profile of transactions involving the selected circuit block for improved communication efficiency. The transaction converter circuit block, for example, addresses or corrects one or more of the transactional inefficiencies identified within the trace data. The transaction converter circuit block further may be configured based upon the detected transactional inefficiencies.

Inclusion of the transaction converter circuit block allows a circuit designer to improve operation of a circuit design and/or IC without having to modify the underlying circuit blocks (e.g., Intellectual Properties (IPs) or cores) of the circuit design. Modifying the underlying circuit blocks themselves may be time consuming and tedious. This process further requires specific skills in hardware design that the designer may lack. In other cases, the circuit blocks may be obtained from third parties as IPs or cores that may not be modifiable. The transaction converter circuit block facilitates efficient operation of the circuit blocks within the circuit design and/or IC.

One or more embodiments are directed to methods of including and/or configuring a transaction converter circuit block within a circuit design adapted for implementation within an IC as performed by a data processing system. One or more embodiments are directed to systems configured for including and/or configuring a transaction converter circuit block within a circuit design adapted for implementation within an IC. One or more embodiments are directed to non-transitory computer-readable storage media storing program code that, when executed, causes a processor to perform and/or initiate a method of including and/or configuring a transaction converter circuit block within a circuit design adapted for implementation within an IC.

Further aspects of the inventive arrangements are described below in greater detail with reference to the figures. For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 illustrates an example data processing system (system) 100. As pictured, system 100 includes at least one processor 105 coupled to a memory 110 through interface circuitry 115. Examples of interface circuitry 115 include, but are not limited to, an input/output (I/O) subsystem, an I/O interface, a bus system, a memory interface, and so forth. System 100 stores computer readable instructions (also referred to as "program code") within memory 110. Memory 110 may be considered an example of computer readable storage media. Processor 105 executes the program code accessed from memory 110 via interface circuitry 115.

Memory 110 includes one or more physical memory devices such as, for example, a local memory and one or more bulk storage devices. Local memory refers to random access memory (RAM) or other non-persistent memory device(s) generally used during actual execution of the program code. A bulk storage device may be implemented as a hard disk drive (HDD), solid state drive (SSD), or other persistent data storage device. System 100 may also include one or more cache memories (not shown) that provide temporary storage of at least some program code in order to reduce the number of times program code must be retrieved from the bulk storage device during execution.

System 100 may be coupled to one or more I/O devices such as a keyboard, a display device, a pointing device, and/or one or more network adapters. A network adapter enables system 100 to become coupled to other systems, computer systems, remote printers, and/or remote storage devices. Examples of network adapters may include, but are not limited to, modems, Ethernet cards, bus adapters, connectors, wireless transceivers and/or radios, and so forth. System 100 may include one or more additional I/O device(s) beyond the examples provided. The I/O devices described herein may be coupled to system 100 either directly or through intervening I/O controllers.

As pictured, memory 110 may store an operating system 150, one or more application(s) 155, and data 160. Application 155, for example, may be an electronic design automation (EDA) application. In one aspect, operating system 150 and application 155, being implemented in the form of executable program code, are executed by system 100 and, more particularly, by processor 105, to perform the various operations described within this disclosure. As such, operating system 150 and application 155 may be considered an integrated part of system 100.

Operating system 150, application 155, and any data (e.g., data 160) used, generated, and/or operated upon by system 100 are functional data structures that impart functionality when employed as part of system 100 or are provided to an IC for implementation therein. As defined within this disclosure, a "data structure" is a physical implementation of a data model's organization of data within a physical memory. As such, a data structure is formed of specific electrical or magnetic structural elements in a memory. A data structure imposes physical organization on the data stored in the memory as used by an application program executed using a processor.

In the example of FIG. 1, data 160 may include a circuit design 165 and a circuit design 170, once generated. Processor 105 is capable of reading circuit design 165 from memory 110 and operating on circuit design 165. Processor 105, in performing the operations described herein, generates a version of circuit design 165 shown as circuit design 170. Circuit design 170 is functionally equivalent to circuit design 165 albeit specifying structurally different circuitry than circuit design 165 that is adapted for more efficient operation.

In one or more embodiments, data 160 includes trace data 175. In an embodiment, trace data 175 is collected from a simulation of circuit design 165. In another embodiment, trace data 175 is collected from trace circuitry implemented within an IC that implements circuit design 165. In either case, trace data 175 includes transactions that are exchanged between one or more circuit blocks of circuit design 165. For example, trace data 175 specifies values for signals, e.g., signal waveforms, generated by and/or between the circuit blocks over a specified period of time.

Processor 105, in executing application 155, is adapted to analyze trace data 175. Processor 105 is capable of detecting one or more transactional inefficiencies within trace data 175. Each transactional inefficiency, for example, indicates an inefficiency in operation and/or communication of one or more circuit blocks of circuit design 165. The transactional inefficiencies occur at the transaction level of communications conducted between two or more circuit blocks of interest, e.g., circuit blocks for which trace data 175 is collected.

In one or more embodiments, processor 105 is capable of modifying circuit design 165 to generate circuit design 170. Processor 105 is capable of inserting a transaction converter circuit block (transaction converter) within circuit design 165 that addresses or corrects one or more of the transactional inefficiencies found in trace data 175. Processor 105 further is capable of configuring the transaction converter based upon the transactional inefficiencies detected within trace data 175. For example, processor 105 is capable of adjusting configuration settings of the transaction converter using values determined from trace data 175.

In another embodiment, processor 105 is capable of adjusting configuration settings of one or more other circuit blocks within circuit design 165. For example, processor 105 is capable of disabling interleaving circuitry of a circuit block within circuit design 165.

In one or more embodiments, system 100 configured to access a library 180 within a data storage device coupled to system 100 via I/O device 130. Library 180, like data 160, is a functional data structure. In one aspect, library 180 stores one or more core cores that may be combined by processor 105, based upon the detected transactional inefficiencies, to generate a transaction converter for inclusion in circuit design 165. In another aspect, library 180 may store one or more different transaction converters from which system 100 may select, based upon the detected transactional inefficiencies. System 100 may include the selected transaction converter within circuit design 165.

The resulting circuit design 170 may be further processed and/or optimized. Processor 105 may generate a version of circuit design 170 that may be provided to, and loaded within, an IC. As an illustrative example, processor 105 may perform operations such as synthesis, placement, routing, and/or bitstream generation to create a configuration bitstream. System 100 may load the configuration bitstream into an IC such as a programmable IC to implement circuit design 170 therein. Thus, circuit design 170 is adapted for implementation within an IC. The IC may be a an application-specific IC, a field programmable gate array (FPGA), a system-on-chip (SOC), or other type of IC including those that may be partially programmable.

System 100 may include fewer components than shown or additional components not illustrated in FIG. 1 depending upon the particular type of device that is implemented. In addition, the particular operating system and/or application(s) included may vary according to device type as may the types of network adapter(s) included. Further, one or more of the illustrative components may be incorporated into, or otherwise form a portion of, another component. For example, a processor may include at least some memory. As a further example, library 180 may be stored within memory 110, e.g., as part of data 160.

Figure 2:
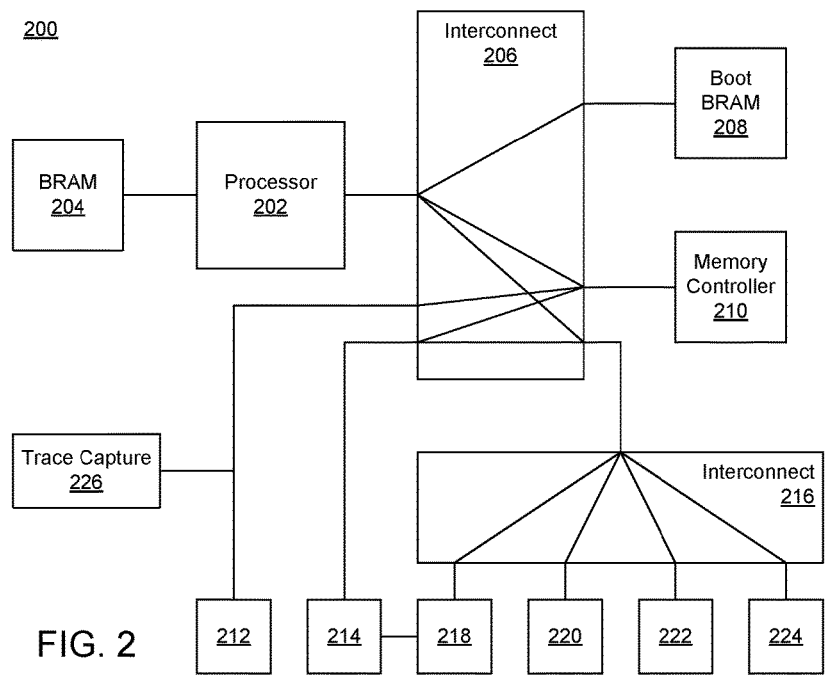
FIG. 2 illustrates an example circuit.

FIG. 2 illustrates an example circuit 200. In an embodiment, circuit 200 is an implementation of circuit design 165 of FIG. 1. As pictured, circuit 200 includes a plurality of different types of circuit blocks. These circuit blocks are coupled by one or more interconnects. In one or more embodiments, circuit 200 is implemented within a programmable IC. An FPGA is an example of a programmable IC. Circuit 200 further may be implemented within an SOC. The SOC may include programmable circuitry. For example, the SOC may include a processor coupled to programmable (e.g., FPGA) circuitry.

Circuit 200 includes a processor 202 coupled to a block random access memory (BRAM) 204. Processor 202 is coupled to an interconnect 206. Interconnect 206 is coupled to boot BRAM 208, memory controller 210, circuit blocks 212 and 214, and to interconnect 216. Memory controller 210 may be coupled to a memory such as any of a variety of known RAMs (not shown) that may operate as a "main memory." Interconnect 216 is coupled to circuit blocks 218, 220, 222, and 224. Through interconnect 206, for example, processor 202 is capable of communicating with boot BRAM 208, memory controller 210, circuit blocks 212 and/or 214, and to any of circuit blocks 218-224 through interconnect 216.

Interconnects 206 and 216 may be implemented as on-chip interconnects. An example of an on-chip interconnect is an AMBA eXtensible Interface (AXI) bus. An AMBA AXI bus is an embedded microcontroller bus interface for use in establishing on-chip connections between circuit blocks and/or systems. Other example implementations of interconnects may include, but are not limited to, buses, crossbars, network on chips (NoCs), and so forth.

Circuit blocks 212, 214, and 218-224 may be implemented as programmable circuitry, hardwired circuit blocks, or a combination thereof. For purposes of illustration, one or more of circuit blocks 212, 214, and 218-224 may be implemented as a DMA circuit block, an SDx Kernel, a Peripheral Component Interconnect (PCI) circuit block, an Ethernet Media Access Controller (EMAC) circuit block, a Universal Asynchronous Receiver Transmitter (UART) circuit block, a General Purpose Input/Output (GPIO) circuit block, an interrupt controller (INTC) circuit block, a bridge, and so forth. The list of different types of circuit blocks that may be implemented by circuit blocks 212, 214, and 218-224 is provided for purposes of illustration only and, as such, is not intended to be limiting. Circuit blocks 212, 214, and 218-224 may implement other types of circuit blocks not listed herein.

For purposes of discussion, circuit block 212 is considered the selected circuit block for which trace data is collected. Accordingly, a trace capture circuit block (trace capture) 226 is included within circuit 200. Trace capture 226 is coupled to the signal lines coupling circuit block 212 and interconnect 206. In one or more embodiments, trace capture 226 is coupled to an interface of circuit block 212.

Trace capture 226 is capable of storing the signals sent from and/or received by circuit block 212. Trace capture 226 is configured to store the captured signals within an on-chip memory (not shown) or to output the captured signals to another destination (e.g., memory) located off-chip. Trace capture 226 is configured to generate trace data 175 described with reference to FIG. 1. Thus, trace capture 226 stores transaction data exchanged between circuit block 212 and one or more other circuit blocks of circuit 200. For example, trace capture 226 is capable of storing transactions between circuit block 212 and interconnect 206, circuit block 212 and memory controller 210, circuit block 212 and processor 202, etc.

In one or more embodiments, circuit block 212 is implemented as a core. As defined herein, the term "core" means a pre-designed and reusable unit of logic, cell, or chip layout design in the field of electronic circuit design. A core, sometimes referred to as an "Intellectual Property Core" or "IP," is stored as a data structure that describes hardware that performs a particular function. A core may be expressed using hardware description language file(s), as a netlist, as a bitstream that programs a programmable IC, or the like. A core may be used as a building block within a circuit design. In this regard, one or more of circuit blocks 214 and 218-224 may also be implemented as cores.

Examples of different varieties of cores include, but are not limited to, digital signal processing (DSP) functions, memories, storage elements, math functions, etc. Other examples of cores may include those already described as example implementations of the circuit blocks of circuit 200. Some cores include an optimally floor-planned layout targeted to a specific family of ICs. In some cases, cores may be parameterizable in that values for configuration parameters may be set or specified to activate or change certain functionality of a core. In other cases, cores are not configurable at all and operate as a black box type of circuit.

For purposes of illustration, circuit block 212 is a master that communicates with a slave circuit block of circuit 200. An example of a slave is memory controller 210. Some circuit blocks, such as memory controller 210, have complex behaviors. To communicate with the memory controller 210 efficiently, circuit block 212 must be matched to memory controller 212 in terms of transaction characteristics, transaction sequences, timing, priorities, and so forth. Matching these characteristics, however, is complex and tedious work.

For example, memory controller 210 may be a high bandwidth memory controller that prefers transactions that are long, continuous linear bursts with high address locality and infrequent read/write direction changes. Changing the design of circuit block 212 to produce more efficient and/or ideal transaction timing for memory controller 210 can be difficult. In another example, where processor 202 is the selected circuit block, modifying the software executed by processor 202 to produce more efficient and/or ideal transaction timing for memory controller 210 can be difficult.

In any case, circuit block 212 (or another selected circuit block such as processor 202) may not be configured properly by the designer. In other cases, circuit block 212 may not be configurable at all. For example, circuit block 212 may be a black box component that a designer is able to incorporate into a circuit design, but not change. Processor 202 may execute program code that may not be editable. In any case, the selected circuit block, which is circuit block 212 for purposes of illustration, may not operate efficiently within circuit 200.

Accordingly, in one or more embodiments, a system such as system 100 is capable of analyzing trace data 175 captured by trace capture 226. For example, the system is capable of analyzing trace data 175 at the transaction level to determine information such as data handshakes, back pressure cycles, idle cycles, latency, transaction pipeline depth, data interleaving, average/peak/min/max throughput, and so forth. From trace data 175, the system is able to identify one or more transactional inefficiencies that occur in communications involving selected circuit block 212. The transactional inefficiencies may be one or more or combinations of the noted data items determined from within trace data 175 that meet predetermined conditions described in greater detail with reference to FIG. 3.

In one or more other embodiments, circuit 200 is simulated. For example, a system as described with reference to FIG. 1 is capable of simulating circuit design 165 using simulation software, e.g., an application. In that case, circuit design 165 need not specify a trace capture circuit block as pictured in FIG. 2. Instead, a designer may indicate to the system which signals should be captured for the trace during runtime.

The system is capable of determining data traffic behavior of circuit block 212 from trace data 175. The system is capable of selecting and/or configuring a transaction converter that can be inserted into circuit 200. The transaction converter is adapted to automatically convert the traffic of the selected circuit block, e.g., circuit block 212, processor 202, or other circuit block that may be selected for analysis, to a format that is more suited for communication with a slave circuit block such as memory controller 210.

The transaction converter may be configured to perform operations including, but not limited to, aggregating transactions together, caching, buffering, adjusting transaction priority, and/or implementing a packet mode. Inclusion of the transaction converter may be fully automated thereby relieving the designer from having to modify the selected circuit block. This type of automation and intelligence is well suited for use by designers that create designs using high level programming languages that are converted into circuit designs and/or for designers that write hardware accelerated kernels in high level programming languages as in each case the designer is not required to analyze waveforms in order to detect and fix inefficiencies in transaction processing in the circuitry.

Figure 3:
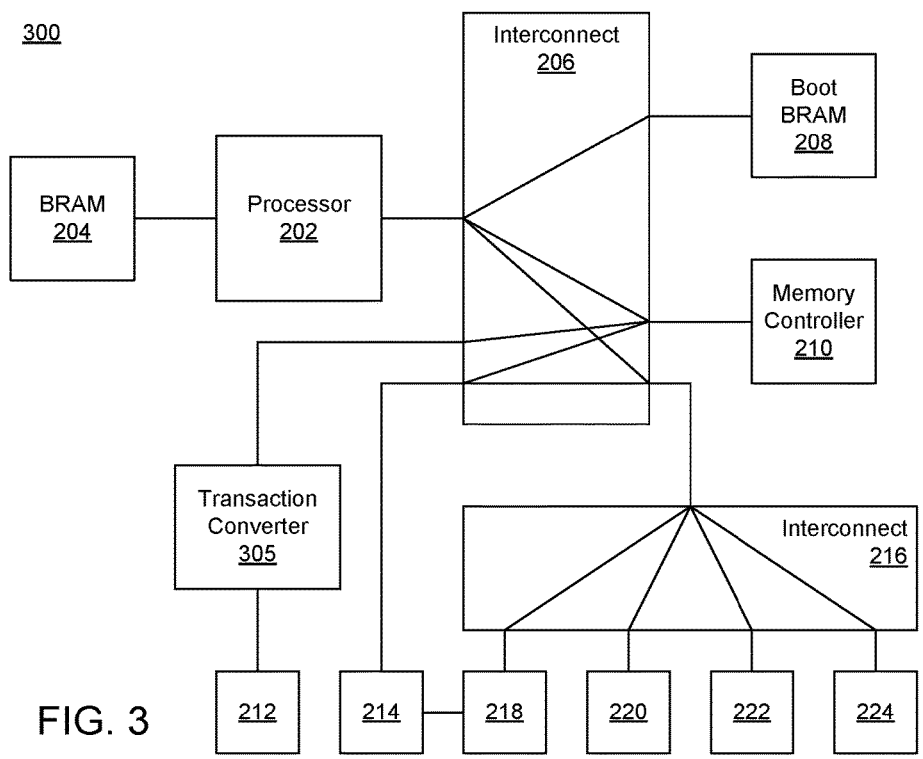
FIG. 3 illustrates another example circuit.

FIG. 3 illustrates an example circuit 300. In one embodiment, circuit 300 is an implementation of circuit design 170 of FIG. 1. Circuit 300 is substantially similar to circuit 200 of FIG. 2. In the example of FIG. 3, however, a transaction converter 305 is included. Further, trace capture 226 is removed. As pictured, transaction converter 305 is included between circuit block 212 and another circuit block. In this case, transaction converter 305 is included between circuit block 212 and interconnect 206. Thus, transaction converter 305 is inserted between circuit block 212 and memory controller 210. It should be appreciated that in other embodiments, transaction converter 305 may be included between two circuit blocks that have a direct connection, e.g., without an interconnect.

In an embodiment, transaction converter 305 is capable of aggregating, or coalescing, two or more transactions together into a single, larger transaction. For example, the system is capable of analyzing trace data 175 to detect a transactional inefficiency such as circuit block 212 initiating a minimum number of read and/or write transactions with memory controller 210. In one aspect, the system is also capable of detecting transactions for an amount of data that is less than a threshold amount of data indicating a small transaction size.

In response to detecting the transactional inefficiency, the system is capable of inserting transaction converter 305. Further, the system is capable of configuring transaction converter 305 to perform aggregation. Accordingly, transaction converter 305 is capable of aggregating two or more transactions from circuit block 212 into a single, larger transaction called an aggregated transaction. Transaction converter 305 is capable of providing the aggregated transaction to another circuit block such as memory controller 210. Similarly, transaction converter 305 is capable of separating data received in response to an aggregated transaction from the other circuit block, e.g., memory controller 210, into a plurality of smaller transactions that are provided back, or served, to circuit block 212.

For purposes of illustration, in some cases, a circuit block is implemented in a manner that initiates read and/or write transactions where each such transaction involves only a small amount of data. This type of configuration may occur in cases where the circuit block is generated from high level programming language created by a designer with little knowledge of hardware design. These smaller memory accesses are often inefficient in the hardware domain when accessing memory controller 210. As discussed, memory controllers are usually adapted to transfer large amounts of data. Moving data in smaller amounts is inefficient as each individual data transfer requires a significant amount of setup. Memory controller 210 operates more efficiently by combining smaller transactions into an aggregated transaction.

In another example, circuit block 212 may access a byte per transaction in a sequential order from memory controller 210. The system is capable of detecting a plurality of these single byte transactions within trace data 175 as a transactional inefficiency. Accordingly, transaction converter 305, once included and configured, is capable of identifying the single byte transactions and aggregating the transactions into a single, larger transaction that covers multiple bytes.

In another example, memory controller 210 may have an interface width of 512 bits (64 bytes). Memory controller 210 may be optimized to operate with increased efficiency in cases where bursts of 8 of these 512 bit transactions are received at a time (e.g., one per cycle). The system may know or determine that circuit block 212 is coupled to memory controller 210 and further know the characteristics of memory controller 210. In that case, the system is capable of configuring transaction converter 305 to aggregate the smaller transactions into a burst of 8 transactions with each transaction being for 512 bits.

In another example, the system may configure transaction converter 305 to aggregate transactions into a size between 512 bytes and 4,096 bytes. The particular sizes of the transactions are provided for purposes of illustration and not limitation. In one or more embodiments, the threshold for determining whether a transaction is small and should be aggregated, the number of transactions to aggregate, and/or the desired size or range of sizes for the aggregated transactions may be configuration parameters of transaction converter 305 that the system is capable of setting.

The system may set the configuration parameters of transaction converter 305 automatically based upon the other core or cores (e.g., circuit block 212 and/or memory controller 210) with which transaction converter 305 is to operate. Further, the system may set the configuration parameters of transaction converter 305 based upon trace data 175. For example, the system may set the size of transactions to be aggregated, the number of transactions to aggregate, and the size for the aggregated transaction based upon actual observed transaction size and/or numbers found in trace data 175.

In another embodiment, transaction converter 305 implements a buffer memory. In one aspect, the buffer memory may be implemented as one or more first-in-first-out (FIFO) memories. For example, the system is capable of analyzing trace data 175 to detect transaction latency and/or transaction pipeline depth as transactional inefficiencies. The system is capable of detecting transaction latency by determining one or more clock cycles between the issuing of a request from circuit block 212 and the time that the request is fulfilled. The system is capable of detecting transaction pipeline depth by determining the number of transactions that are requested by circuit block 212 of another circuit block such as memory controller 210 in advance.

Using transaction latency and transaction pipeline depth as determined from analyzing waveforms of the trace data, the system is capable of determining a need for a buffer memory and also a size of the buffer memory implemented by transaction converter 305. For example, the system is capable of sizing the buffer memory, e.g., a FIFO memory, based, at least in part, upon detected latency. The system is capable of sizing the buffer memory to store a particular number of data items that is equivalent to the latency. If, for example, the system determines a latency of 10 clock cycles from trace data 175, the system may size the buffer memory to hold 10 data items. Thus, the size of the buffer memory is an example of a configuration parameter for transaction converter 305 that may be set by the system based upon analysis of trace data 175.

In another embodiment, transaction converter 305 implements a cache memory. For example, the system is capable of analyzing trace data 175 to detect a transactional inefficiency, or indicator thereof, such as detecting locality of addresses and/or locality of time in requests. Locality of time refers to data traffic accesses of a same region (or page) of memory a plurality of different times. The system may determine a need for a cache in response to detecting locality of time in trace data 175. The system, in response to identifying data accesses with locality of time, may configure transaction converter 305 to implement a cache memory adapted to retrieve a large block of data from a main memory and store the retrieved data therein, e.g., in the cache memory. In that case, data converter 305 can serve multiple transactions to circuit block 212 more quickly than had the transactions been provided to memory controller 210 to access a main memory.

Locality of address refers to performing one or more reads of a same address within a defined time interval. The time interval is relatively short. The system is capable of detecting accesses to a same address within the time interval as a transactional inefficiency and, in response, configure transaction converter 305 as a cache memory. The system can configure transaction converter 305 as a cache memory to store data that was accessed previously so that when the same address is accessed again, the access is served by transaction converter 305 rather than by accessing a main memory.

As an illustrative example, when the transaction converter is configured to perform caching, the cache size may be set as a configuration parameter. In one or more embodiments, the system is capable of setting cache size based upon address and/or time locality of data. For example, if the system determines that most data that is accessed repeatedly occurs within a 4 KB region of memory based upon trace data 175, the system sets the cache size configuration parameter to 4 KB.

In another embodiment, transaction converter 305 is adapted to modify priority of transactions. For example, the system is capable of analyzing trace data 175 to detect a transactional inefficiency such as a "greedy" master. The system is capable of detecting a transactional inefficiency such as circuit block 212 requesting a large number of large transactions, e.g., more than a predetermined number of transactions, with a size exceeding a size threshold.

As an illustrative and non-limiting example, the system may detect that circuit block 212 requests 16 transactions, where each transaction is large in size, e.g., approximately 4 KB. This series of transactions may tie up memory controller 210 and prevent other devices from accessing memory controller 210 during that time. In that case, the system may configure transaction converter 305 to lower the priority of the transactions from circuit block 212 so that the large number of requests do not prevent other circuit blocks from gaining access to memory controller 210.

In another embodiment, transaction converter 305 is adapted to implement a packet mode. As an illustrative example, circuit block 212 may be configured to request a read or a write transaction for a size of 1 KB. Memory controller 210 may be configured to operate in an optimized manner as previously described. In asking for 1 KB of data, circuit block 212 asks for 8 different 512 bit transactions. Since memory controller 210 operates more efficiently with transfers of 512 bytes in 8 clock cycles, transferring 512 bits (64 bytes) every "N" clock cycles, where N is greater than one, is inefficient and may cause memory controller 210 to tie up the data channel while waiting for the 8 pieces of data to all complete. In that case, the system detects a transactional inefficiency within trace data 175.

Accordingly, the system may configure transaction converter 305 to implement a packet mode. In the case of writes, for example, the system configures transaction converter 305 to wait until all 8 transactions are received in an internal, e.g., a FIFO, buffer. Upon receiving all 8 transactions within the buffer, transaction converter 305 is capable of informing memory controller 210 that there is a transaction. Since transaction converter 305 is storing and holding all 8 transactions when transaction converter 305 makes the request to memory controller 210, transaction converter 305 is capable of sending data in all 8 cycles so the data bus of memory controller 210 is not occupied longer then needed.

In implementing packet mode in the case of reads, the system is capable of configuring transaction converter 305 to hold and store read requests and not issue the read requests to memory controller 210 until transaction converter 305 has free buffer storage available to receive results of the read requests. As such, transaction converter 305 is capable of receiving and storing all the read data returned by memory controller 210 without delay and serve the data to circuit block 212 at a reduced rate without tying up the data bus of memory controller 210.

While FIG. 3 is illustrated with transaction converter 305 being coupled to circuit block 212, in another example, where processor 202 is the selected circuit block transaction converter 305 may be coupled to processor 202 to process transactions exchanged between processor 202 and another circuit block.

Figure 4:
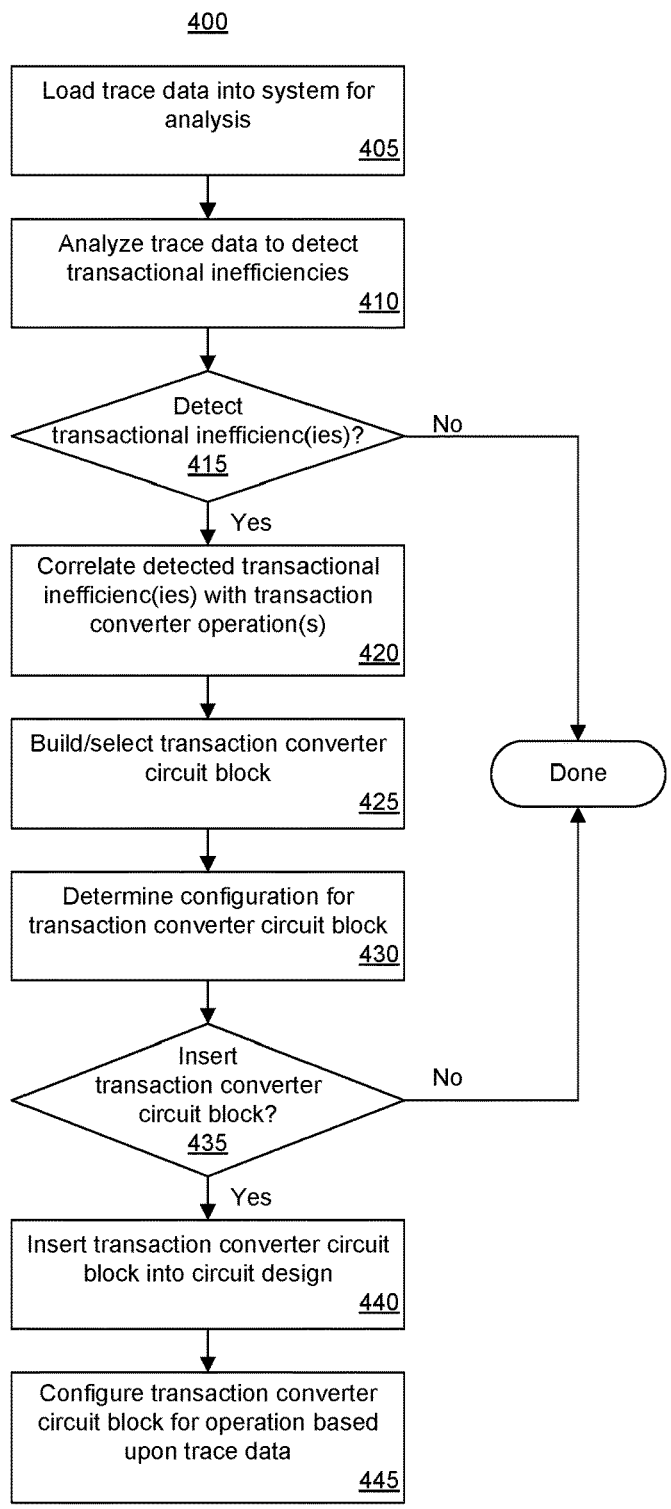
FIG. 4 illustrates an example method of modifying a circuit design and/or circuit.

FIG. 4 illustrates an example method 400 of modifying a circuit design. Method 400 may be performed by a system as described with reference to FIG. 1. Method 400 may be performed automatically by the system. Method 400 further starts in a state where trace data has been generated for the circuit and/or circuit design and is available for analysis. As discussed, in one or more embodiments, the trace data is generated from an actual implementation of the circuit design within an IC using a trace capture adapted to collect transaction data for a selected circuit block. In one or more other embodiments, the system, or another data processing system, is capable of simulating the circuit design and generating trace data for the selected circuit block. As discussed, in one or more embodiments, the selected circuit block may be a processor.

In block 405, the system loads the trace data for analysis. For example, the system may load the trace data into runtime memory for analysis. In block 410, the system analyzes the trace data to detect one or more transactional inefficiencies. The system is capable of analyzing the trace data to detect one or more different transactional inefficiencies. Each transactional inefficiency may serve to indicate the need for a particular type of transaction converter operation that, if performed, improves operation of the circuit design. In block 415, the system determines whether one or more of the transactional inefficiencies are detected within the trace data. If so, method 400 continues to block 420. If not, method 400 may end.

In block 420, the system correlates the detected transactional inefficiencies with particular transaction converter operations. In one embodiment, available transaction converter operations are associated with different types of transactional inefficiencies. Each detected transactional inefficiency, or combination of transactional inefficiencies, detected from the trace data may be matched to a transaction converter operation.

For purposes of illustration, a latency and/or transaction pipeline type of transactional inefficiency may be correlated with memory buffer operations. A transactional inefficiency involving a plurality of transactions that are candidates for aggregation can be correlated with aggregation operations. In one aspect, the transaction converter operations are implemented as cores within a library. Each core is adapted to perform a transaction converter operation and, within the library, is associated with one or more transactional inefficiencies.

In block 425, the system is capable of building a transaction converter that implements the particular transaction converter operations determined in block 420. For each transactional inefficiency and/or for different combinations of transactional inefficiencies identified in block 410, the system is capable of including, within the transaction converter, a core adapted to perform the transaction converter operation that is associated with (e.g., and that corrects) the particular transactional inefficiency and/or combination of transactional inefficiencies found in the trace data.

For example, in response to detecting transactional inefficiencies indicating a need for aggregation from the trace data, the system selects the core that is adapted to perform aggregation. In response to detecting transactional inefficiencies indicating a need for a memory buffer from the trace data, the system selects the core that is implements a memory buffer. In response to detecting transactional inefficiencies indicating a need for caching, the system selects the core that implements a cache memory. In response to detecting transactional inefficiencies indicating a need for modifying priority of transactions, the system selects the core that is adapted to modify priority of transactions. In response to detecting transactional inefficiencies indicating a need for packet mode, the system selects the core that implements the packet mode.

It should be appreciated that the system may include more than one type of core within the transaction converter to address the transactional inefficiencies detected within the trace data. As such, the transaction converter may be implemented to perform more than one type of transaction converter operation based upon the particular transactional inefficiencies that are detected within the trace data. The order of cores and/or connectivity of cores within the transaction converter may be determined based upon one or more rules stored within the system for linking or connecting the cores.

In one or more other embodiments, the library includes a plurality of different transaction converters that are pre-built. In that case, the system need not build a transaction converter, but rather may select a particular transaction converter from the library of available transaction converters for inclusion within the circuit design. The system is capable of selecting a transaction converter from the plurality of transaction converters in the library based upon the particular transactional inefficiencies that are detected from the trace data. For example, each transaction converter in the library may be associated with one or more transactional inefficiencies. The system may select a transaction converter from the library that is associated with transactional inefficiencies that match the particular transactional inefficiencies detected from the trace data.

In one or more other embodiments, the library may include a transaction converter that is configured to perform each or all of the various transaction converter operations described herein. In that case, the system may select the transaction converter and only enable those particular transaction converter operations that are deemed necessary based upon the particular transactional inefficiencies detected within the trace data.

In block 430, the system is capable of determining a configuration for the transaction converter. As discussed in connection with FIG. 3, the system is capable of determining values for configuration parameters of the transaction converter based upon the trace data and, more particularly, based upon the detected transactional inefficiencies from the trace data. The system is capable of setting any of the configuration parameters described with reference to FIG. 3 for the transaction converter.

In block 435, the system determines whether to insert the transaction converter into the circuit design. In one or more embodiments, the system is capable of querying the user as to whether to include the transaction converter within the circuit design. For example, the system may present a user interface asking the user whether to add the transaction converter to the circuit design. The user may respond with a yes or no, for example.

In one or more embodiments, the system is capable of calculating a cost of including the transaction converter. For example, the system is capable of calculating the number of gates of the target IC that are needed to implement the transaction converter. As part of the query, e.g., within the user interface, the system may indicate the number of gates needed to implement the transaction converter. The gate information, or cost, allows the user to determine whether to expend the number of gates indicated in order to improve transaction processing for the IC.

If the system determines that the transaction converter is to be included in the circuit design, method 400 continues to block 440. If the system determines that the transaction converter is not to be included in the circuit design, method 400 may end.

Continuing with block 440, the system generates a different version of the circuit design by inserting the transaction converter into the circuit design. In one or more embodiments, the system inserts the transaction converter between the selected circuit block and another (e.g., a second) circuit block in communication with the selected circuit block. In inserting the transaction converter, the system disconnects the selected circuit block from the second circuit block of the circuit design, adds the transaction converter into the circuit design, couples the selected circuit block to the transaction converter, and couples the transaction converter to the second circuit block.

Referring to FIG. 3, for example, the system modifies circuit design 165 by disconnecting circuit block 212 from interconnect 206. The system inserts transaction converter 305 within circuit design 165. The system then connects transaction converter 305 to circuit block 212 and to interconnect 206, resulting in circuit design 170. Appreciably, the system may remove any trace capture circuit blocks from circuit design 165 as well.

In block 445, the system configures the transaction converter for operation based upon the trace data. For example, the system writes the particular values determined in block 430 to the configuration parameters of the transaction converter.

In one or more other embodiments, the system is capable of determining, from the trace data, that one or more operations enabled within a circuit block of the circuit design are not being used. As an illustrative example, the system may determine, from the trace data, that the selected circuit block does not utilize data interleaving. In response to determining that data interleaving circuitry is enabled in the selected circuit block, the system is capable of modifying the circuit design by disabling the data interleaving circuitry or other circuitry not being used.

In one or more embodiments, the system also performs further operations to implement the circuit design within an IC. For example, the system may perform synthesis, placement, routing, and/or configuration bitstream generation. In one or more embodiments, the modified circuit design including the transaction converter circuit block is implemented within the IC. For example, a configuration bitstream specifying the modified circuit design is loaded into an IC thereby implementing the circuitry of the modified circuit design within the IC.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined herein, the singular forms "a," "an," and "the" are intended to include the plural forms as well, unless the context clearly indicates otherwise. As defined herein, the term "another" means at least a second or more. As defined herein, the terms "at least one," "one or more," and "and/or," are open-ended expressions that are both conjunctive and disjunctive in operation unless explicitly stated otherwise. For example, each of the expressions "at least one of A, B and C," "at least one of A, B, or C," "one or more of A, B, and C," "one or more of A, B, or C," and "A, B, and/or C" means A alone, B alone, C alone, A and B together, A and C together, B and C together, or A, B and C together. As defined herein, the term "automatically" means without user intervention.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing. Memory elements, as described herein, are examples of a computer readable storage medium. A non-exhaustive list of more specific examples of a computer readable storage medium may include: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing.

As defined herein, the term "coupled" means connected, whether directly without any intervening elements or indirectly with one or more intervening elements, unless otherwise indicated. Two elements may be coupled mechanically, electrically, or communicatively linked through a communication channel, pathway, network, or system. As defined herein, the terms "includes," "including," "comprises," and/or "comprising," specify the presence of stated features, integers, steps, operations, elements, and/or components, but do not preclude the presence or addition of one or more other features, integers, steps, operations, elements, components, and/or groups thereof. As defined herein, the term "output" means storing in physical memory elements, e.g., devices, writing to display or other peripheral output device, sending or transmitting to another system, exporting, or the like. As defined herein, the term "plurality" means two or more than two.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context. As defined herein, the term "responsive to" means responding or reacting readily to an action or event. Thus, if a second action is performed "responsive to" a first action, there is a causal relationship between an occurrence of the first action and an occurrence of the second action. The term "responsive to" indicates the causal relationship.

As defined herein, the terms "one embodiment," "an embodiment," or similar language mean that a particular feature, structure, or characteristic described in connection with the embodiment is included in at least one embodiment described within this disclosure. Thus, appearances of the phrases "in one embodiment," "in an embodiment," and similar language throughout this disclosure may, but do not necessarily, all refer to the same embodiment.

As defined herein, the term "processor" means at least one hardware circuit configured to carry out instructions contained in program code. The hardware circuit may be an integrated circuit. Examples of a processor include, but are not limited to, a central processing unit (CPU), an array processor, a vector processor, a digital signal processor (DSP), a field-programmable gate array (FPGA), a programmable logic array (PLA), an application specific integrated circuit (ASIC), programmable logic circuitry, a graphics processing unit (GPU), a controller, and so forth.

The terms first, second, etc. may be used herein to describe various elements. These elements should not be limited by these terms, as these terms are only used to distinguish one element from another unless stated otherwise or the context clearly indicates otherwise.

A computer program product may include a computer readable storage medium (or media) having computer readable program instructions thereon for causing a processor to carry out aspects of the inventive arrangements described herein. Within this disclosure, the term "program code" is used interchangeably with the term "computer readable program instructions." Computer readable program instructions described herein may be downloaded to respective computing/processing devices from a computer readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object oriented programming language and/or procedural programming languages. Computer readable program instructions may include state-setting data. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer readable program instructions by utilizing state information of the computer readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer readable program instructions, e.g., program code.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the operations specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The corresponding structures, materials, acts, and equivalents of all means or step plus function elements that may be found in the claims below are intended to include any structure, material, or act for performing the function in combination with other claimed elements as specifically claimed.

One or more embodiments are directed to methods of circuit design. In one aspect, a method can include detecting, using a processor, a transactional inefficiency within trace data including transactions involving a first circuit block of a circuit design and, in response to the detecting, generating a modified version of the circuit design by including a transaction converter circuit block within the circuit design. The transaction converter circuit block can be coupled to the first circuit block and can be adapted to correct the transactional inefficiency.

The method can include determining a value of a configuration parameter of the transaction converter circuit block based upon the transactional inefficiency detected within the trace data and setting the configuration parameter using the value.

In an aspect, the transaction converter circuit block included within the circuit design can be selected from a plurality of different transaction converter circuit blocks based upon a type of the transactional inefficiency detected within the trace data.

In another aspect, the transaction converter circuit block can be generated from a library of cores selected for inclusion in the transaction converter circuit block based upon the transactional inefficiency detected within the trace data.

In another aspect, the transaction converter circuit block can be adapted to adjust priority of transactions of the first circuit block.

In another aspect, the transaction converter circuit block can be adapted to implement a packet mode of communication between the first circuit block and a second circuit block.

In another aspect, the transaction converter circuit block can be adapted to perform at least one of buffering or caching.

In another aspect, the transaction converter circuit block can be adapted to perform aggregation.

The method can also include disabling data interleaving circuitry of the first circuit block in response to determining that data interleaving is not used by the first circuit block from the trace data.

One or more embodiments are directed to systems for circuit design. In one aspect, a system includes a processor configured to detect a transactional inefficiency within trace data including transactions involving a first circuit block of a circuit design and, in response to detecting the transactional inefficiency, generate a modified version of the circuit design by including a transaction converter circuit block within the circuit design. The transaction converter circuit block can be coupled to the first circuit block and can be adapted to correct the transactional inefficiency.

The processor can also be configured to determine a value of a configuration parameter of the transaction converter circuit block based upon the transactional inefficiency detected within the trace data and set the configuration parameter using the value.

In an aspect, the transaction converter circuit block included within the circuit design can be selected from a plurality of different transaction converter circuit blocks based upon a type of the transactional inefficiency detected within the trace data.

In another aspect, the transaction converter circuit block can be generated from a library of cores selected for inclusion in the transaction converter circuit block based upon the transactional inefficiency detected within the trace data.

In another aspect, the transaction converter circuit block can be adapted to adjust priority of transactions of the first circuit block.

In another aspect, the transaction converter circuit block can be adapted to implement a packet mode of communication between the first circuit block and a second circuit block.

In another aspect, the transaction converter circuit block can be adapted to perform at least one of buffering or caching.

In another aspect, the transaction converter circuit block can be adapted to perform aggregation.

The processor can also be configured to disable data interleaving circuitry of the first circuit block in response to determining that data interleaving is not used by the first circuit block from the trace data.

One or more embodiments are directed to computer program products for circuit design. In one aspect, a computer program product includes a computer readable storage medium having program code stored thereon. The program code is executable by a processor to cause the processor to detect a transactional inefficiency within trace data including transactions involving a first circuit block of a circuit design and, in response to detecting the transactional inefficiency, generate a modified version of the circuit design by including a transaction converter circuit block within the circuit design. The transaction converter circuit block can be coupled to the first circuit block and can be adapted to correct the transactional inefficiency.

The program code can be executable by a processor to cause the processor to determine a value of a configuration parameter of the transaction converter circuit block based upon the transactional inefficiency detected within the trace data and set the configuration parameter using the value.

In an aspect, the transaction converter circuit block included within the circuit design can be selected from a plurality of different transaction converter circuit blocks based upon a type of the transactional inefficiency detected within the trace data.

In another aspect, the transaction converter circuit block can be generated from a library of cores selected for inclusion in the transaction converter circuit block based upon the transactional inefficiency detected within the trace data.

In another aspect, the transaction converter circuit block can be adapted to adjust priority of transactions of the first circuit block.

In another aspect, the transaction converter circuit block can be adapted to implement a packet mode of communication between the first circuit block and a second circuit block.

In another aspect, the transaction converter circuit block can be adapted to perform at least one of buffering or caching.

In another aspect, the transaction converter circuit block can be adapted to perform aggregation.

The program code can be executable by a processor to cause the processor to disable data interleaving circuitry of the first circuit block in response to determining that data interleaving is not used by the first circuit block from the trace data.

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the inventive arrangements disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. A method, comprising:
    detecting, using a processor, a transactional inefficiency within trace data including transactions involving a circuit block of a circuit design;
    wherein the transactional inefficiency includes a number of the transactions exceeding a predetermined number of transactions and each of the transactions exceeding a size threshold; and
    in response to the detecting, generating, using the processor, a modified version of the circuit design by including a transaction converter circuit block within the circuit design;
    wherein the transaction converter circuit block is coupled to the circuit block and is adapted to correct the transactional inefficiency by adjusting a priority of at least one of the transactions involving the circuit block; and
    wherein the modified version of the circuit design including the transaction converter circuit block is processed to generate a configuration bitstream loaded into a programmable integrated circuit implementing the modified version of the circuit design therein.

2. The method of claim 1, wherein the transactional inefficiency includes at least one of locality of addresses or locality of time for data accessed by the transactions, and wherein the transaction converter circuit block is configured to correct the transactional inefficiency by caching previously accessed data.

3. The method of claim 1, wherein the transaction converter circuit block included within the circuit design is selected from a plurality of different transaction converter circuit blocks based upon a type of the transactional inefficiency detected within the trace data.

4. The method of claim 1, wherein the transaction converter circuit block is generated from a library of cores selected for inclusion in the transaction converter circuit block based upon the transactional inefficiency detected within the trace data.

5. The method of claim 1, wherein the transactional inefficiency includes a plurality of the transactions, each for accessing an amount of data less than a threshold amount of data, and wherein the transaction converter circuit block is configured to correct the transactional inefficiency by aggregating the plurality of the transactions into a single aggregated transaction for a memory controller and separating data received in response to the aggregated transaction to correspond to the plurality of the transactions to provide to the circuit block.

6. The method of claim 1, wherein the transaction converter circuit block is adapted to implement a packet mode of communication between the circuit block and a further circuit block.

7. The method of claim 1, wherein the transaction converter circuit block is adapted to perform at least one of buffering or caching.

8. The method of claim 1, wherein the transaction converter circuit block is adapted to perform aggregation.

9. The method of claim 1, further comprising:
    disabling data interleaving circuitry of the circuit block in response to determining that data interleaving is not used by the circuit block from the trace data.

10. A system, comprising:
    a processor configured to:
    detect a transactional inefficiency within trace data including transactions involving a circuit block of a circuit design;
    wherein the transactional inefficiency includes a number of the transactions exceeding a predetermined number of transactions and each of the transactions exceeding a size threshold; and
    in response to detecting the transactional inefficiency, generate a modified version of the circuit design by including a transaction converter circuit block within the circuit design;
    wherein the transaction converter circuit block is coupled to the circuit block and is adapted to correct the transactional inefficiency by adjusting a priority of at least one of the transactions involving the circuit block; and
    wherein the modified version of the circuit design including the transaction converter circuit block is processed to generate a configuration bitstream loaded into a programmable integrated circuit implementing the modified version of the circuit design therein.

11. The system of claim 10, wherein the transactional inefficiency includes at least one of locality of addresses or locality of time for data accessed by the transactions, and wherein the transaction converter circuit block is configured to correct the transactional inefficiency by caching previously accessed data.

12. The system of claim 10, wherein the transaction converter circuit block included within the circuit design is selected from a plurality of different transaction converter circuit blocks based upon a type of the transactional inefficiency detected within the trace data.

13. The system of claim 10, wherein the transaction converter circuit block is generated from a library of cores selected for inclusion in the transaction converter circuit block based upon the transactional inefficiency detected within the trace data.

14. The system of claim 10, wherein the transactional inefficiency includes a plurality of the transactions, each for accessing an amount of data less than a threshold amount of data, and wherein the transaction converter circuit block is configured to correct the transactional inefficiency by aggregating the plurality of the transactions into a single aggregated transaction for a memory controller and separating data received in response to the aggregated transaction to correspond to the plurality of the transactions to provide to the circuit block.

15. The system of claim 10, wherein the transaction converter circuit block is adapted to implement a packet mode of communication between the circuit block and a further circuit block.

16. The system of claim 10, wherein the transaction converter circuit block is adapted to perform at least one of buffering or caching.

17. The system of claim 10, wherein the transaction converter circuit block is adapted to perform aggregation.

18. The system of claim 10, wherein the processor is further configured to:
disable data interleaving circuitry of the circuit block in response to determining that data interleaving is not used by the circuit block from the trace data.

19. A computer program product comprising a computer readable storage medium having program code stored thereon, the program code executable by a processor to cause the processor to:
detect a transactional inefficiency within trace data including transactions involving a circuit block of a circuit design;
wherein the transactional inefficiency includes a number of the transactions exceeding a predetermined number of transactions and each of the transactions exceeding a size threshold; and
in response to detecting the transactional inefficiency, generate a modified version of the circuit design by including a transaction converter circuit block within the circuit design;
wherein the transaction converter circuit block is coupled to the circuit block and is adapted to correct the transactional inefficiency by adjusting a priority of at least one of the transactions involving the circuit block; and
wherein the modified version of the circuit design including the transaction converter circuit block is processed to generate a configuration bitstream loaded into a programmable integrated circuit implementing the modified version of the circuit design therein.

20. The computer program product of claim 19, wherein the transactional inefficiency includes at least one of locality of addresses or locality of time for data accessed by the transactions, and wherein the transaction converter circuit block is configured to correct the transactional inefficiency by caching previously accessed data.

* * * * *